(12) United States Patent
Rana et al.

(10) Patent No.: US 9,159,425 B2
(45) Date of Patent: Oct. 13, 2015

(54) NON-VOLATILE MEMORY WITH REDUCED SUB-THRESHOLD LEAKAGE DURING PROGRAM AND ERASE OPERATIONS

(71) Applicants: STMicroelectronics International N.V., Amsterdam (NL); STMicroelectronics S.r.l., Agrate Brianza (MB) (IT)

(72) Inventors: Vikas Rana, Noida (IN); Ganesh Raj R, New Delhi (IN); Fabio De Santis, Milan (IT)

(73) Assignees: STMicroelectronics International N.V., Amsterdam (NL); STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/089,016

(22) Filed: Nov. 25, 2013

(65) Prior Publication Data

US 2015/0146490 A1  May 28, 2015

(51) Int. Cl.
*G11C 16/14* (2006.01)
*G11C 16/04* (2006.01)

(52) U.S. Cl.
CPC .................................. *G11C 16/0433* (2013.01)

(58) Field of Classification Search
None
See application file for complete search history.

(56) References Cited

U.S. PATENT DOCUMENTS

| | | |
|---|---|---|
| 4,878,203 A | 10/1989 | Arakawa |
| 6,363,014 B1 | 3/2002 | Fastow |
| 6,788,584 B2 | 9/2004 | Tedrow et al. |
| 7,113,430 B2 | 9/2006 | Hoefler et al. |
| 7,463,525 B2 | 12/2008 | Zheng et al. |
| 8,139,416 B2 | 3/2012 | Chong et al. |
| 8,374,016 B2 | 2/2013 | Correll |
| 2006/0044876 A1* | 3/2006 | Shone et al. ............. 365/185.28 |
| 2009/0114951 A1* | 5/2009 | Lojek ........................... 257/202 |

* cited by examiner

*Primary Examiner* — James G Norman
(74) *Attorney, Agent, or Firm* — Gardere Wynne Sewell LLP

(57) ABSTRACT

A memory includes an array of non-volatile memory cells. Each cell includes a select transistor in series connection with a floating gate transistor. The cells are configurable for operation in a programming mode and an erase mode. When in the programming mode, the gate terminal of the select transistor is driven with a negative bias voltage so as to bias that transistor in the accumulation region and eliminate sub-threshold leakage. When in the erase mode, the gate terminal of a pull-down transistor coupled to the memory cell is driven with a negative bias voltage so as to bias that transistor in the accumulation region and eliminate sub-threshold leakage.

29 Claims, 11 Drawing Sheets

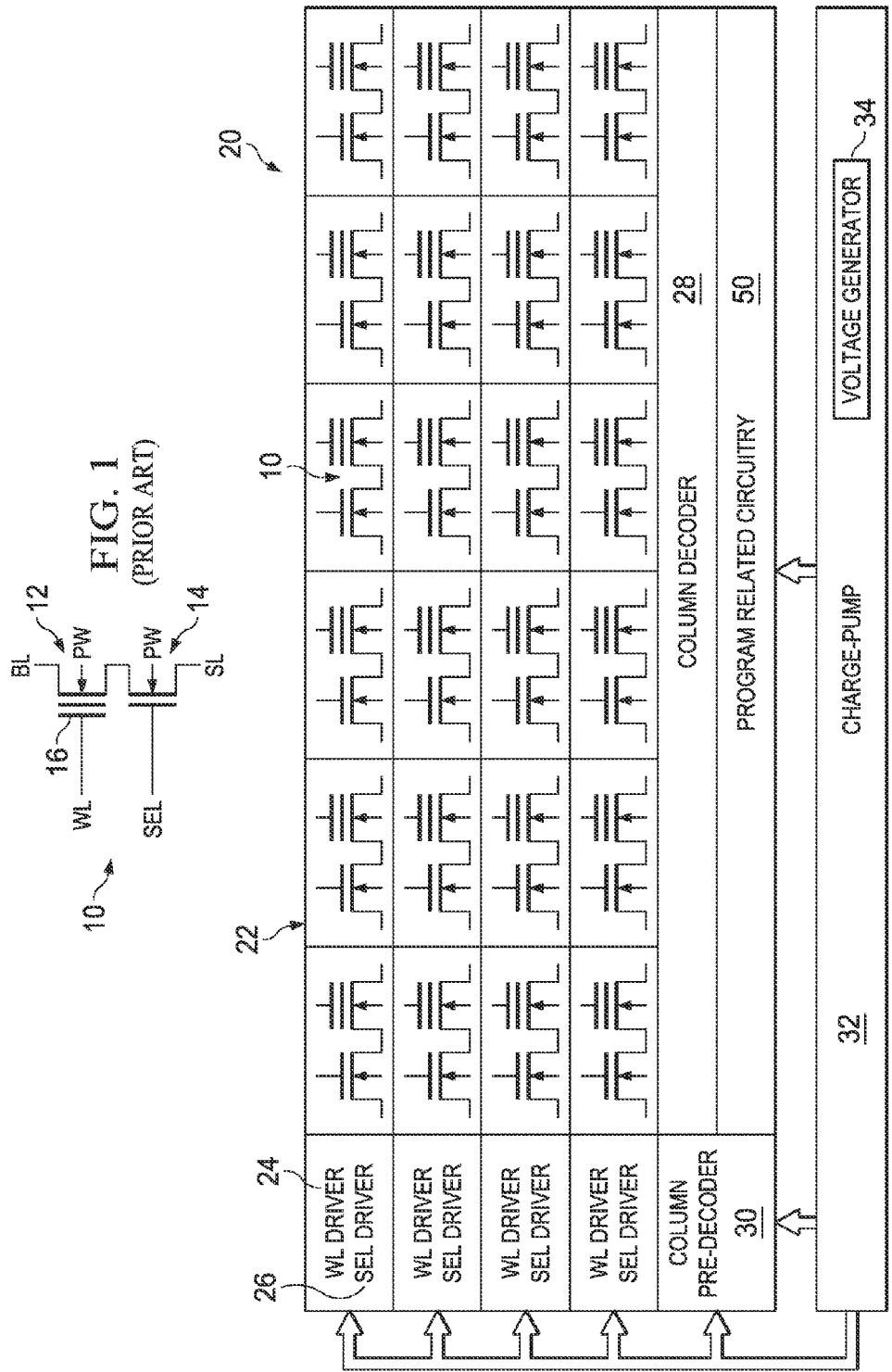

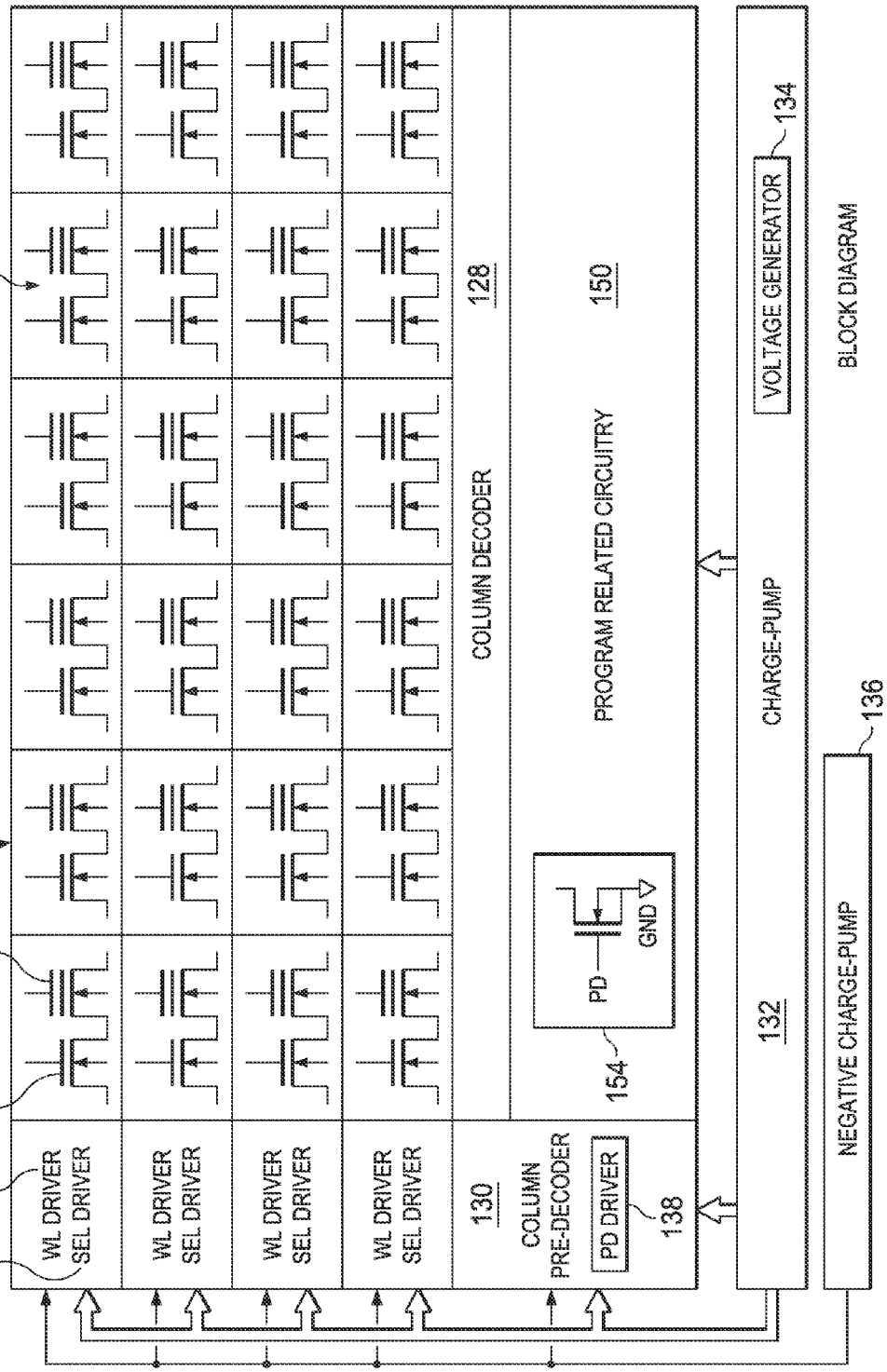

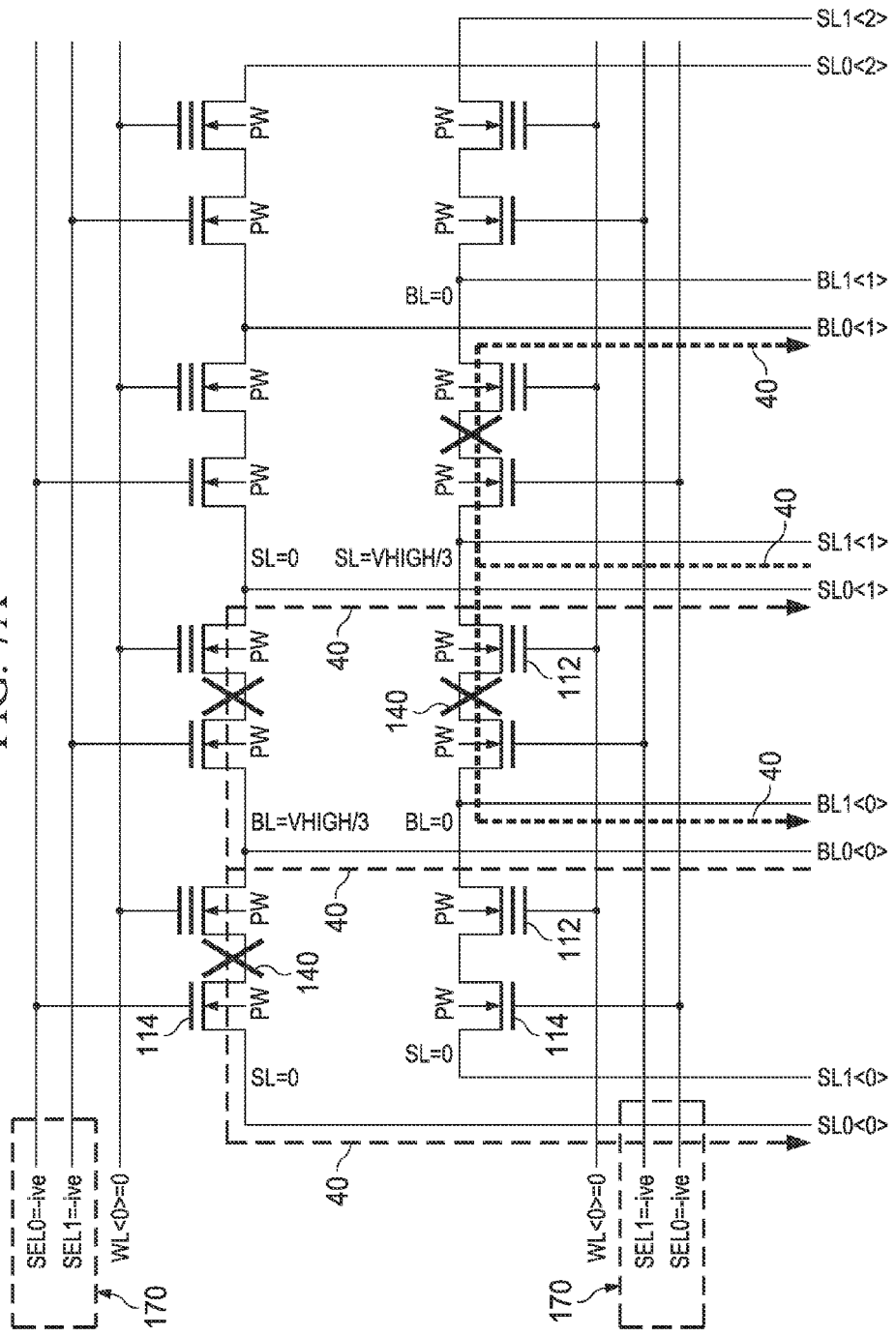

NON-VOLATILE MEMORY WITH REDUCED SUB-THRESHOLD LEAKAGE DURING PROGRAM AND ERASE OPERATIONS

TECHNICAL FIELD

The present invention relates to an integrated circuit (IC) memory and, in particular, to a non-volatile memory and a technique for reducing or eliminating sub-threshold leakage concerns during memory access for programming and erasing operations.

BACKGROUND

Reference is now made to FIG. 1 which illustrates a circuit diagram of a conventional non-volatile memory cell 10. The cell 10 comprises a first transistor 12 and a second transistor 14. The first transistor 12 is a memory transistor and is configured with a floating gate structure 16 known to those skilled in the art. The floating gate structure 16 can be implemented in a number of ways: for example through the use specific process steps or by the use of a capacitor connected at the gate of a conventional NMOS transistor. The wordline (WL) for the cell 10 is connected to the gate (control terminal) of the memory floating gate first transistor 12. The second transistor 14, comprising for example a conventional NMOS transistor, functions as a select transistor for the memory floating gate first transistor 12. A select signal (SEL) is applied to the gate of transistor 14. The source-drain paths of the first and second transistors 12 and 14 are connected in series. The drain terminal of the floating gate first transistor 12 is coupled to a bit-line (BL) and a source terminal of the select second transistor 14 is coupled to a source-line (SL). The transistors 12 and 14 are formed in a common P-well (PW). To program the cell 10, charge is stored at floating gate structure 16. The construction, configuration and operation of the cell 10 are well known to those skilled in the art.

FIG. 2 illustrates a block diagram of an exemplary non-volatile memory 20 including a plurality of cells 10 arranged in an array 22. The memory 20 may be implemented as a discrete memory circuit or embedded with other circuitry, such as processing circuitry, in a system on chip (SoC) integrated circuit. FIG. 3 illustrates the details of a portion of the array 22 within memory 20, and in particular shows a subset of the array formed by cells 10 arranged in two sectors. The illustrated number of cells is exemplary only, and those skilled in the art understand that each sector may include many more cells and that the memory will include many more sectors. A word-line (WL) driver circuit 24 is used to select/de-select the word-lines in different operations by applying signals to the gates of the memory floating gate first transistors 12 of individual ones or groups of cells 10. A select line (SEL) driver circuit 26 is used to select/de-select memory cells 10 in different operations by applying signals to the gates of the select transistors 14 of individual ones or groups of cells 10. The voltage levels of the signals applied by the SEL-driver 26 and WL-driver 24 control the operation to select or de-select a particular memory cell 10 as well operate the cell in a number of different operating modes including programming and erase. A column decoder circuit 28 and pre-decoder circuit 30 are used to select the bit-lines (BL<>) and source-lines (SL<>) of the one or more memory cells 10 desired in the programming or erase operations. A charge-pump 32 generates the on-chip high voltage(s) required during program and erase operations for application to specific nodes of the memory cells. The voltage generator block 34 is included as a part of the charge pump 32 for the memory. The high voltages and other multiple voltages are generated by the block 34 from the pumped voltage and routed to different blocks of the memory for selection and application to the memory cells.

The programming operation of the cell 10 utilizes the well-known Fowler-Nordheim (FN) tunneling effect. To perform FN-tunneling, high voltages are required which are generated on-chip through the charge-pump 32 and voltage generator 34 for application to the cells 10. The FN process is well known in the art. Biasing of the nodes of the memory cell in a particular way achieves the FN tunneling effect and programs a desired data value at a selected memory cell. Reference is now made to Table 1 which illustrates the different voltages required in an exemplary implementation to bias a memory cell 10 during a programming operation:

|  | WL | SEL0/SEL1 | BL (programmed cell) | BL (not programmed cell) | PW | SL |
|---|---|---|---|---|---|---|
| Selected sector | VHIGH | 0/0 | 0 | (VHIGH/3) | 0 | 0 or (VHIGH/3) |
| Non-selected sector | 0 | 0/0 | 0 | (VHIGH/3) | 0 | 0 or (VHIGH/3) |

Reference is now made to FIG. 4A which illustrates, in the context of a subset of the array and column decoding circuitry, the programming operation conditions and a resulting leakage path situation. The required voltages are provided with response to a selected sector and non-selected sector (see, FIG. 3). With respect to the selected sector, in order to program a memory cell 10, a VHIGH voltage is applied through the word-line to the gate of the memory floating gate first transistor 12 for the cell 10 being programmed and the bit-lines of that cell are driven to logic "0". The voltage VHIGH is well in excess of logic "1" voltage, for example comprising a voltage of about 15-18V. Also within the selected sector, and with respect to each memory cell 10 that is not being programmed, the VHIGH voltage is applied through the word-line to the gate of the memory floating gate first transistor 12 and the bit-lines of that memory cell 10 are driven to a VHIGH/3 voltage (provided by the voltage generator 34) in order to inhibit the programming operation. During the programming operation, the select transistors 14 in all cells 10 are turned OFF by driving the gate terminals of the select transistors to logic "0" (i.e., applying a Vgs=0).

The array configuration shown in FIG. 3 provides for all bit-lines in the array to be shared across sectors. Thus, the voltages applied to the bit-lines with respect to selected cells 10 in one sector (the selected sector) are also applied to the cells in other sectors (the non-selected sectors).

It is evident that in applying the VHIGH/3 voltage at some of the bit-lines in order to inhibit the programming of non-selected cells in the selected sector, this will force some of the bit-lines at high voltage. Within the selected sector, the select transistor 14 accordingly sees a Vds at the VHIGH/3 voltage because the memory cell 10 is fully ON. However, the select transistor has an assumed state of being perfectly switched OFF because the Vgs=0 for this transistor. Nonetheless, this select transistor 14 exhibits leakage (reference 40 in FIG. 4A) of the sub-threshold conduction type due to the presence of a high Vds at the NMOS select transistor 14. The sub-threshold conduction for the NMOS select transistor is high, and the problem with this leakage is exacerbated at fast corners and high temperature. With respect to the non-selected memory cells in the non-selected sectors, and assuming the non-selected cells are depleted, a high Vds is also seen across the associated NMOS select transistors and this results in a further contribution of sub-threshold array leakage. Indeed, the overall leakage in programming operation can be very high with memories having a larger density cut. For example, for a cut-size of 4 Kbit, this leakage is ~600 uA @ 150 degrees C.

FIG. 4B illustrates simulation results for a memory of the type shown in FIG. 4A and having a 4 Kbit array density operating in programming mode. The simulation results show that during a worst case the array leakage exceeds 600 uA. This leakage will become the current load for the charge-pump during programming.

A similar concern with leakage exists with respect to the erase operation which is also a high voltage operation. The erasing operation of the cell 10 also utilizes the well-known Fowler-Nordheim (FN) tunneling effect. To perform FN-tunneling, high voltages are required which are generated on-chip through the charge-pump 32 for application to the cells 10. The FN process is well known in the art. Biasing of the nodes of the memory cell in a particular way achieves the FN tunneling effect and erases a desired data value at a selected memory cell. Reference is now made to Table 2 which illustrates the different voltages required to bias a memory cell 10 during an erase operation:

|  | WL | SEL0/SEL1 | BL (programmed cell) | BL (not programmed cell) | PD | PW | SL |
|---|---|---|---|---|---|---|---|
| Selected sector | 0 | VHIGH | Floating | Floating | 0 | VHIGH | VHIGH |
| Non-selected sector | VHIGH | VHIGH | Floating | Floating | 0 | VHIGH | VHIGH |

Reference is now made to FIG. 5A which illustrates, in the context of a subset of the array and column decoding circuitry, the erase operation conditions and the leakage path situation. In the erase operation, the word-line in the selected sector is driven to logic "0" and the p-well (PW) is biased at the VHIGH voltage generated by the charge-pump. Those skilled in the art recognize that parasitic diodes exist in the transistors 12 and 14 between the bulk-source junction and bulk-drain junction. So, the source and drain terminals of the memory cell will be charged to a voltage equal to VHIGH-Vt (where Vt is the threshold voltage of the bulk to source-drain junction). Because the bit-lines and source-lines of the whole array are shared, this high voltage of VHIGH-Vt is transferred to the drain terminal of the column decoding transistors within the column decoder 28. In order to protect a first level 44 of the column decoding transistors, the gate and source of the included first level transistors are biased during erase at a 2VHIGH/3 voltage level generated by the charge pump of the voltage generator block 34. Similarly, a next level 46 of column decoding sees a stress at the 2VHIGH/3 voltage. In order to protect the second level 46 of decoding, the gate and source of the included second level transistors are biased at the VHIGH/3 voltage level. The source terminals of the transistors in the second level 46 of the column decoding are also biased through pull-up transistors 48 in a program related circuitry 50 section (FIGS. 2 and 5A) to the VHIGH/3 voltage level (where the included pull-down transistors 54 are controlled in an OFF state by driving their gate terminals to logic "0"). The pull-down transistors 54, however, will see a Vds of the VHIGH/3 voltage level. There is accordingly a sub-threshold leakage current 56. Because the pull-up and pull-down transistor circuits 48/54 within the program related circuitry 50 are repeated in dependence on the number of source-lines and bit-lines and eventually the sector size, it will be understood that the larger the sector the greater the number of circuits 48/54 that are needed, and correspondingly the higher the sub-threshold leakage. For a sector size of 256 bits this leakage is around ~100 uA @ 150 degrees C.

FIG. 5B illustrates simulation results for a memory of the type shown in FIG. 5A and having a 4 Kbit array density operating in erase mode. The simulation results show that during a worst case the array leakage exceeds 90 uA. This leakage will become the current load for the charge-pump during programming.

The leakages during programming and erase operations are not negligible and need to be supported by the on-chip charge-pump. The voltages VHIGH, 2VHIGH/3 and (VHIGH/3) are generated by voltage generator block 34 and specifically responsive to the operation of the charge-pump 32. It is thus noted that the leakage currents during both programming and erase become the current load for the charge-pump. If the charge-pump 32 is not able to support the array leakage, then the memory write and erase operations may fail or may be performed erroneously.

One solution to this problem is to design the charge pump 32 as a very low impedance circuit that can support the anticipated leakage during program and erase operations. A drawback of this solution is that the charge pump will occupy a larger amount of integrated circuit area (due for example to an increased size storage capacitor and additional pumping stages) and there will be a corresponding increase in power consumption. Additionally, this solution drives towards a chip that lacks modularity because any changes in the density of memory array will require a re-design of the charge-pump in order to support the leakage. Such a redesign may adversely affect circuit area and power consumption.

Further, while this leakage is very large in fast corner and higher temperature conditions, in typical operating conditions it is noted that no or very little leakage may occur. The provision of a strong charge-pump to support this anticipated leakage at the fast corner and high temperature conditions accordingly presents an over-design for the typical operating conditions where current load for the charge-pump is lower.

In this case, with a stronger charge pump, the charge pump ripple will be more prominent. It may not be possible to control the ripple and the reliability of the memory operation could then suffer.

There is accordingly a need in the art to reduce or remove the leakage in a non-volatile memory array during program and erase operations which will help in reducing the area occupied by the charge pump and further reduce the power consumed not only by the charge pump but also with respect to the entire system (for example, the system on chip (SoC) which includes the memory array).

SUMMARY

In an embodiment, a memory includes an array of non-volatile memory cells. Each cell includes a select transistor in series connection with a floating gate transistor. The cells are configurable for operation in a programming mode and an erase mode. When in the programming mode, the gate terminal of the select transistor is driven with a negative bias voltage so as to bias that transistor in the accumulation region and reduce or eliminate sub-threshold leakage. When in the erase mode, the gate terminal of a pull-down transistor coupled to the memory cell is driven with a negative bias voltage so as to bias that transistor in the accumulation region and reduce or eliminate sub-threshold leakage.

In an embodiment, a circuit comprises: a non-volatile memory cell including an NMOS select transistor and a floating gate transistor series connected to the NMOS select transistor, the memory cell configurable for operation in a programming mode; and a selection circuit configured to drive a gate terminal of the NMOS select transistor with a negative bias voltage in response to said memory cell being configured to program a data value into said floating gate transistor.

In an embodiment, a circuit comprises: a non-volatile memory cell including an NMOS select transistor and a floating gate transistor series connected to the NMOS select transistor, the memory cell configurable for operation in an erase mode; an NMOS pull-down transistor coupled to said memory cell; and a selection circuit configured to drive a gate terminal of the NMOS pull-down transistor with a negative bias voltage in response to said memory cell being configured to erase a data value on said floating gate transistor.

In an embodiment, a method comprises: configuring a non-volatile memory cell including an NMOS select transistor and a floating gate transistor series connected to the NMOS select transistor in a programming mode; and driving a gate terminal of the NMOS select transistor with a negative bias voltage in response to said memory cell being configured to program a data value into said floating gate transistor.

In an embodiment, a method comprises: configuring a non-volatile memory cell including an NMOS select transistor and a floating gate transistor series connected to the NMOS select transistor in an erase mode; and driving a gate terminal of an NMOS pull-down transistor coupled to said memory cell with a negative bias voltage in response to said memory cell being configured to erase a data value stored on said floating gate transistor.

BRIEF DESCRIPTION OF THE DRAWINGS

For a better understanding of the embodiments, reference will now be made by way of example only to the accompanying figures in which:

FIG. 1 illustrates a circuit diagram of a conventional non-volatile memory cell;

FIG. 2 illustrates a block diagram of an exemplary non-volatile memory including a plurality of cells arranged in an array;

FIG. 6 illustrates a block diagram of a non-volatile memory including a plurality of cells arranged in an array which includes circuitry for addressing sub-threshold conduction;

FIG. 7A illustrates details of the array including application of a negative biasing voltage to address sub-threshold leakage;

DETAILED DESCRIPTION OF THE DRAWINGS

Figure 3:
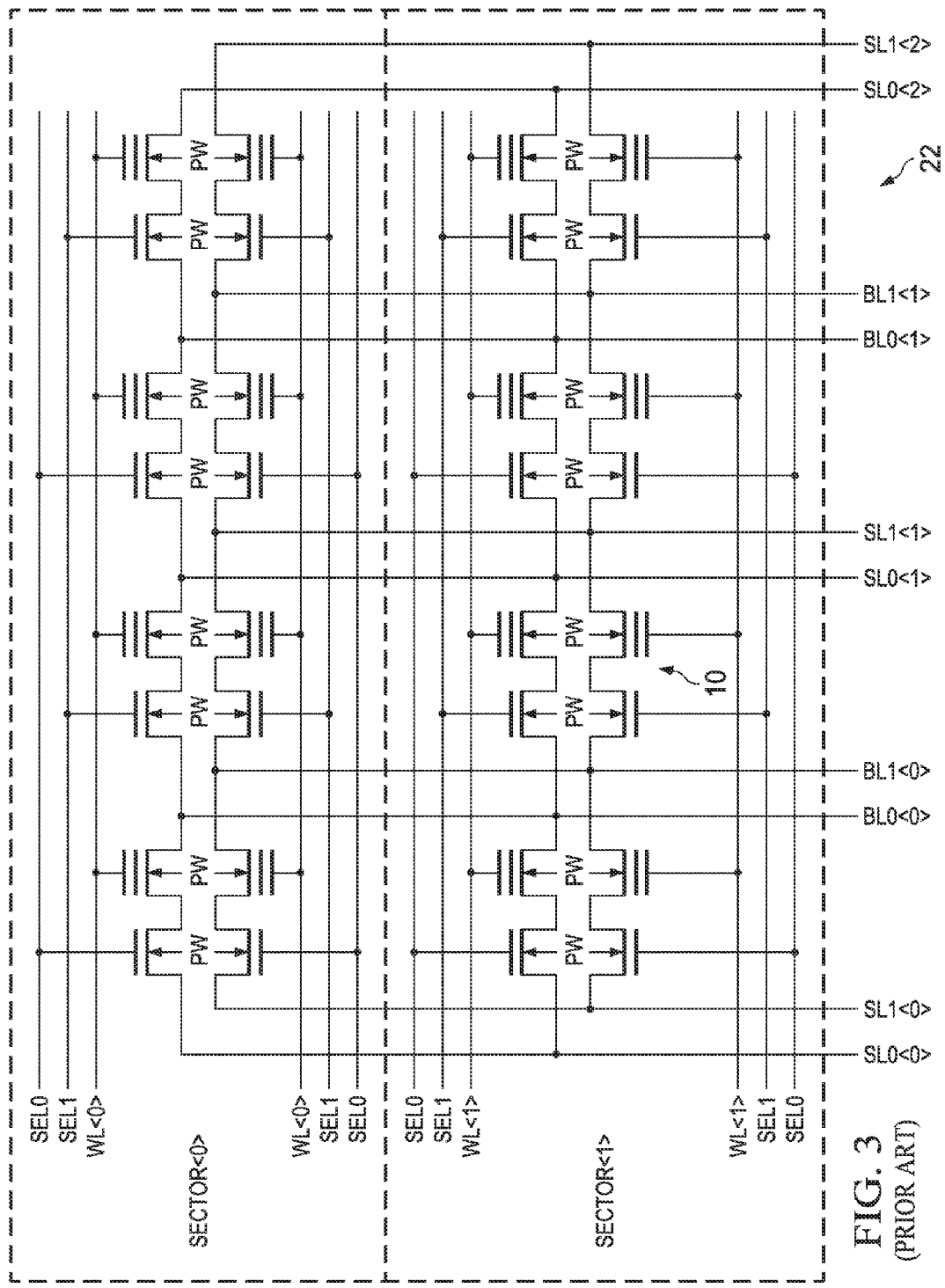
FIG. 3 illustrates details of the array.

The main cause of the leakage concerns identified above is the sub-threshold conduction of NMOS transistors. This sub-threshold conduction is more prominent at higher temperatures. To address this problem, the leakage current is eliminated, or at least reduced, by biasing certain NMOS transistors in the memory with a negative Vgs so that the transistor will operate in the accumulation region resulting in the reduction or elimination of the sub-threshold current leakage.

Embodiments described herein in more detail provide for producing an effective Vgs of the NMOS transistor that is negative so that the transistor is biased for operation in the accumulation region.

Reference is now made to FIG. 6 which illustrates a block diagram of a non-volatile memory 120 including a plurality of cells 110 arranged in an array 122 which includes circuitry for addressing sub-threshold conduction concerns. A negative charge pump circuit 136 is provided, in addition to the positive charge-pump circuit 132 and its included voltage generator block 134, to generate a negative bias voltage (−ive). In a preferred embodiment, the negative bias voltage is not less than a negative threshold voltage (−Vth) of the NMOS transistors used in the memory 120 (in other words, the absolute value of the negative bias voltage is less than the threshold voltage). This is because such a magnitude for the negative bias voltage is sufficient to bias the transistor in the accumulation region (i.e., produce a negative Vgs) and effectuate a reduction in or elimination of leakage current. The negative voltage output from the negative charge pump circuit 136 is provided to the sectors of the array 122 for the purpose of selectively biasing the select transistor 114 coupled in series with the memory floating gate first transistor 112 of the memory cell 110. The negative voltage output from the negative charge pump circuit 136 is further provided to the program related circuitry 150 coupled to the column decoder circuitry 128 for the purpose of selectively biasing the pull down transistors 154 coupled to the column decoder transistors.

Figure 4A:
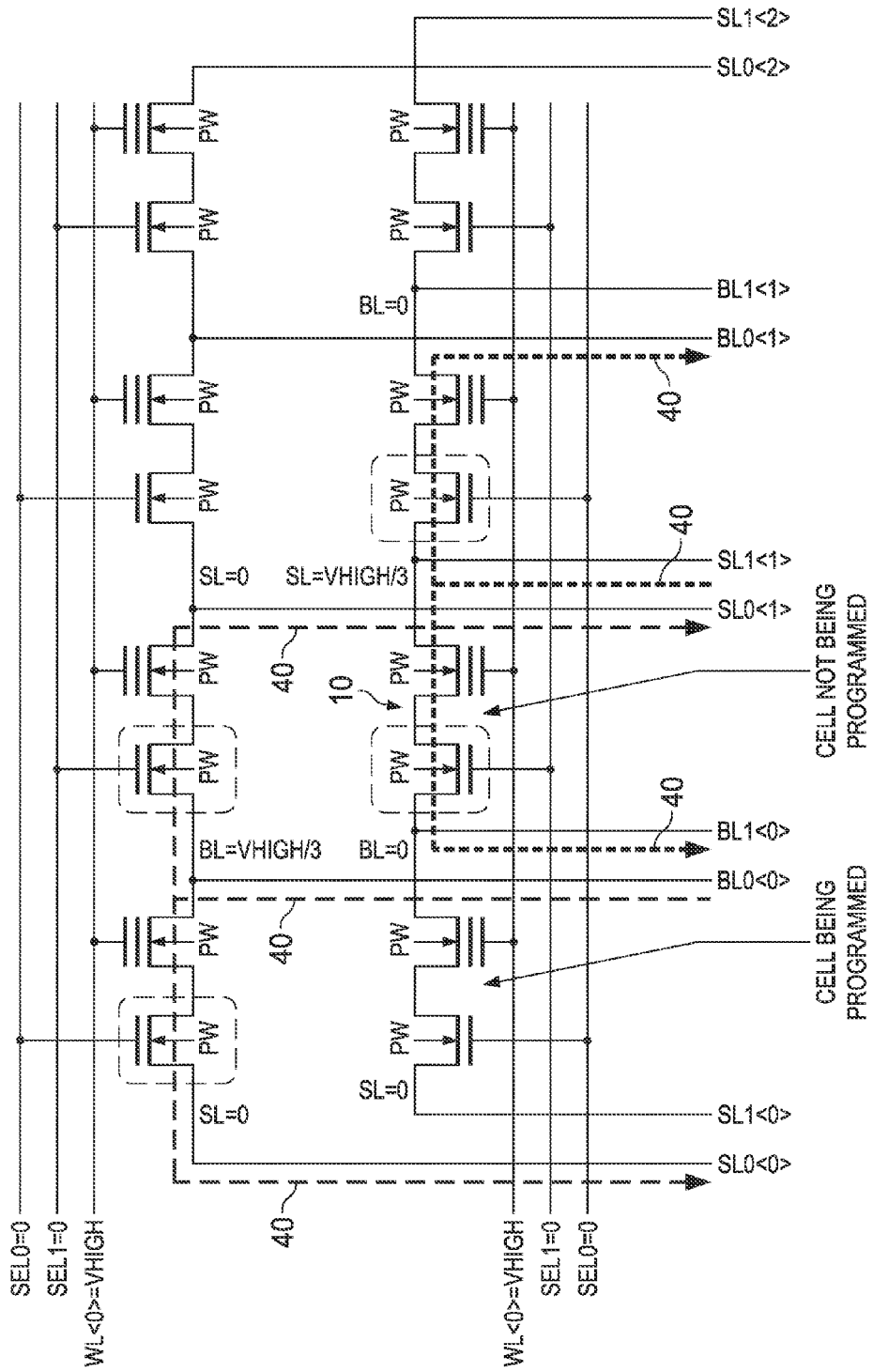
FIG. 4A illustrates a leakage path during the programming operation.

Reference is now made to FIG. 7A which illustrates details of the array 122 including application of a negative biasing voltage to address sub-threshold leakage. The negative biasing voltage is generated by the negative charge pump circuit 136 and selectively applied (reference 170) to the gate terminals of the select transistors 114 within each memory cell 110 during the programming operation. As discussed above in connection with FIG. 4A, the memory cells suffer from a concern with sub-threshold leakage current 40 paths. By selectively biasing the gate terminals of the select transistors 114 with the negative biasing voltage, the Vgs of those NMOS select transistors will be negative. In this condition, the select transistors 114 will be biased in the accumulation region. With the NMOS select transistors 114 controlled to be switched OFF, the sub-threshold current leakage is eliminated (reference 140).

Figure 4B:
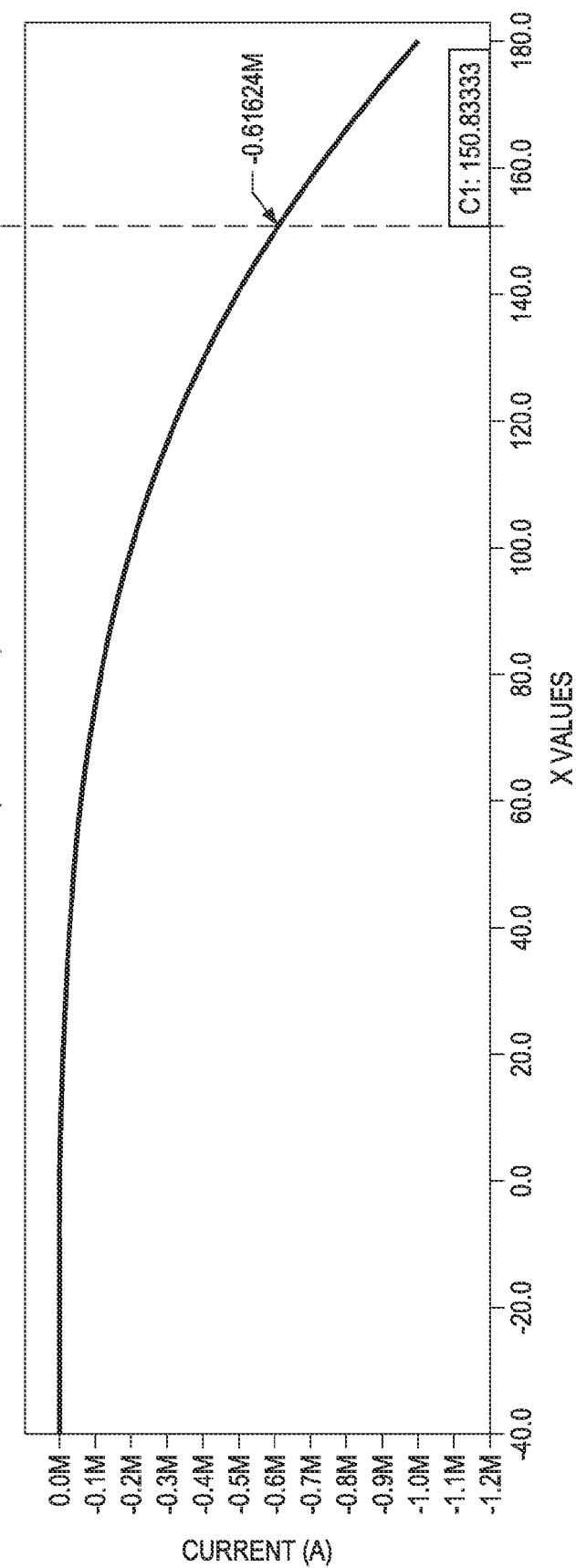
FIG. 4B graphs leakage current in a simulation of the circuit of FIG. 4A.
Figure 7B:
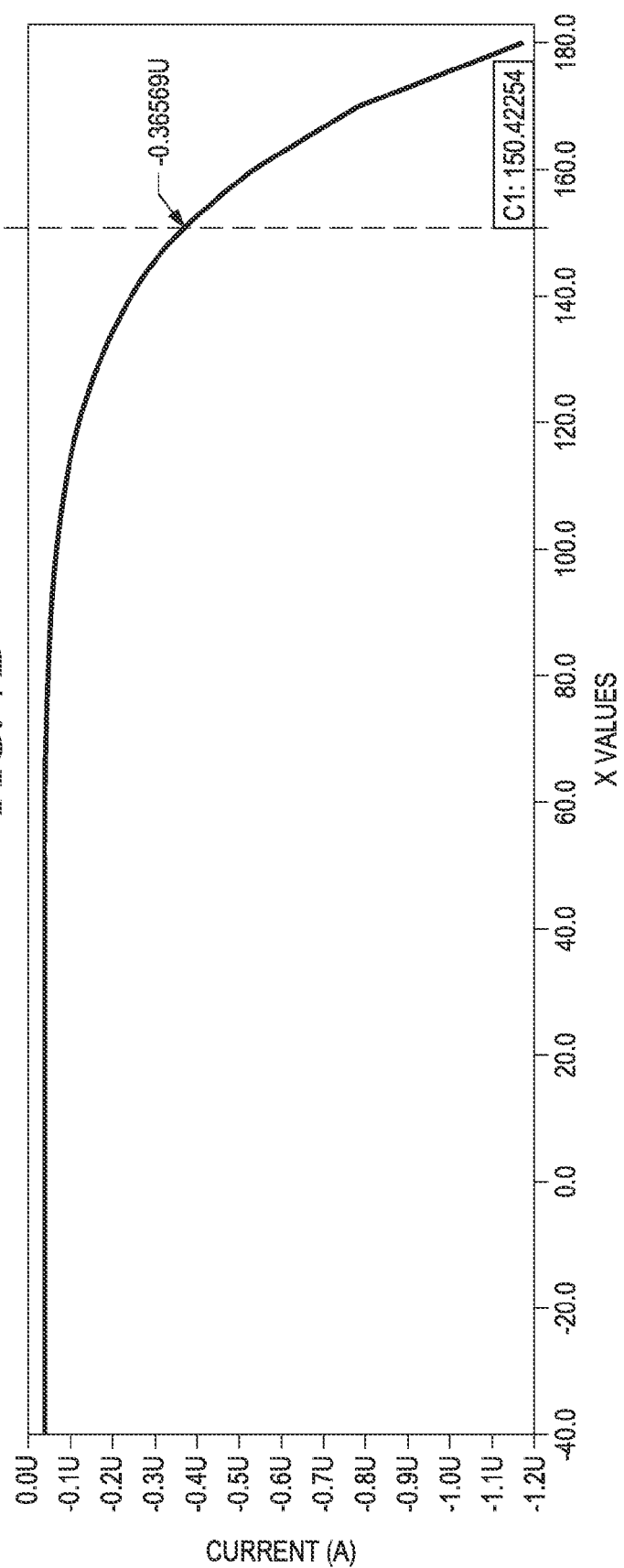
FIG. 7B graphs leakage current in a simulation of the circuit of FIG. 7A.

FIG. 7B illustrates simulation results for a memory of the type shown in FIG. 7A and having a 4 Kbit array density operating in programming mode. The simulation results show that during a worst case the array leakage is about 365 nA (which is significantly reduced from the >600 uA leakage shown in the simulation of FIG. 4B). In this simulation, the negative biasing voltage is −0.5V (with an NMOS threshold voltage Vth≈0.7 V). A small leakage of this scale is much easier for the charge-pump to handle as its current load.

Figure 5A:
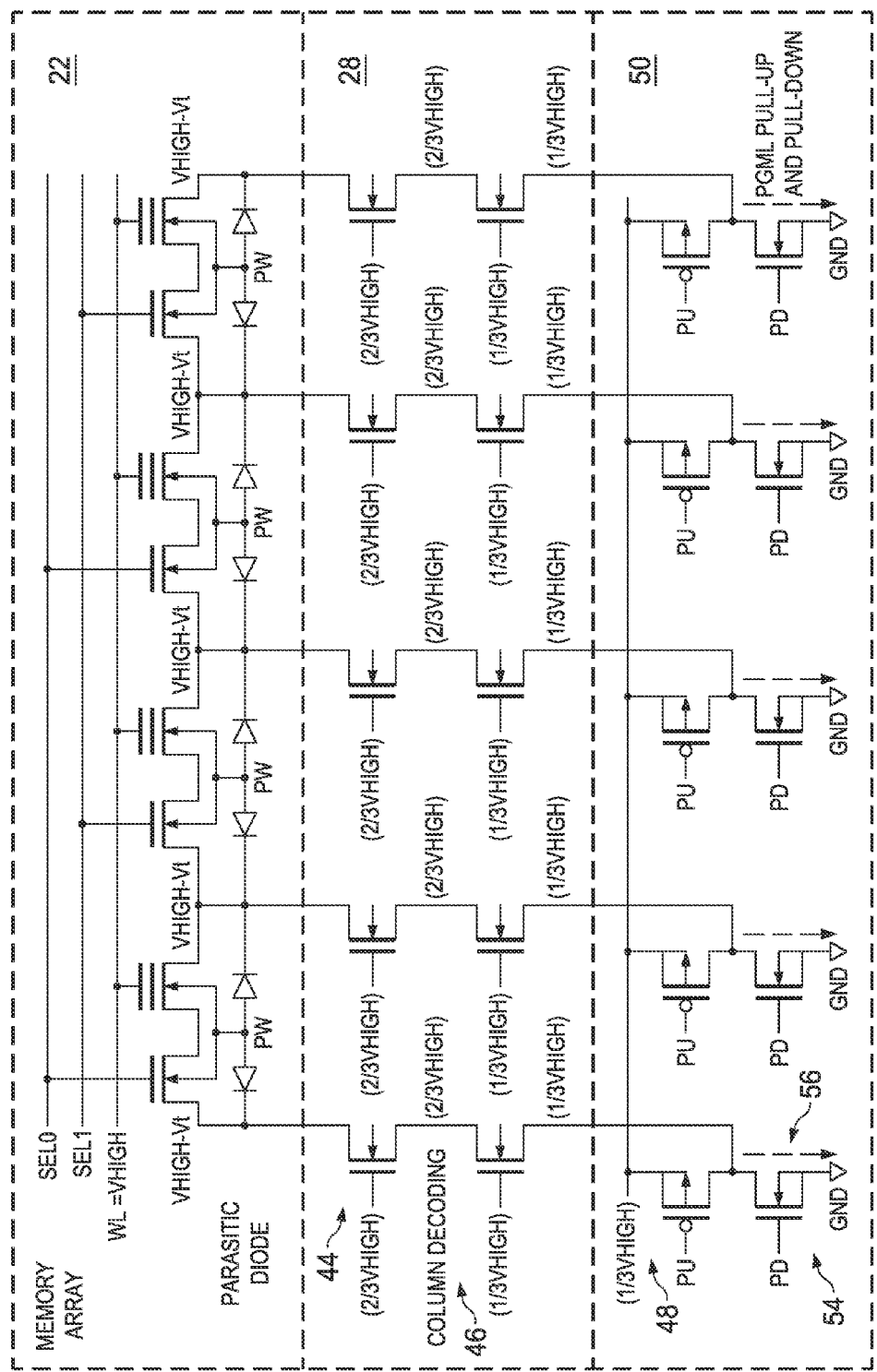
FIG. 5A illustrates a leakage path during the erase operation.

With reference once again to FIG. 6, the select (SEL) driver 126 circuitry is modified in comparison to circuitry 26 (of FIG. 2) to selectively apply the negative biasing voltage to the gate terminals of the select transistors 114 during programming mode. Thus, in connection with the known operations performed by circuitry of the memory to apply voltages as shown in Table 1, above, to the word-lines (WL<>), bit-lines (BLx<>), p well (PW) and source lines (SLx<>) when configuring the memory for a programming operation, the select (SEL) driver 126 responds to placement of the memory in programming mode by passing the negative biasing voltage generated by the negative charge pump circuit 136 to the gate terminals of the select transistors 114 (as signals SELx<>). This circuitry is preferably implemented as a logic circuit which passes the negative biasing voltage instead of the logic "0" voltage (see, Table 1). This is illustrated by Table 3:

136 and selectively applied (reference 172) to the gate terminals of the pull-down transistors 154 in the program related circuit 150 (coupled to the column decoder circuitry 128 and array 122) during the erase operation. The pull-down transistors 154 are coupled in series with pull-up transistors 148. The series connection node between transistor 148 and transistor 154 is coupled to the series connected transistors in the levels 144 and 146 of the column decoder circuitry 128 which are, in turn, coupled to the bit-lines and source-lines of the array 122. As discussed above in connection with FIG. 5A, the pull-down transistors suffer from a concern with sub-threshold leakage current 56 paths. By selectively biasing the gate terminals of the pull-down transistors 154 with the negative biasing voltage, the Vgs of those NMOS pull-down transistors will be negative. In this condition, the pull-down transistors 154 will be biased in accumulation region. With the NMOS pull-down transistors 154 controlled to be switched OFF, the sub-threshold current leakage is eliminated (reference 156).

Figure 5B:
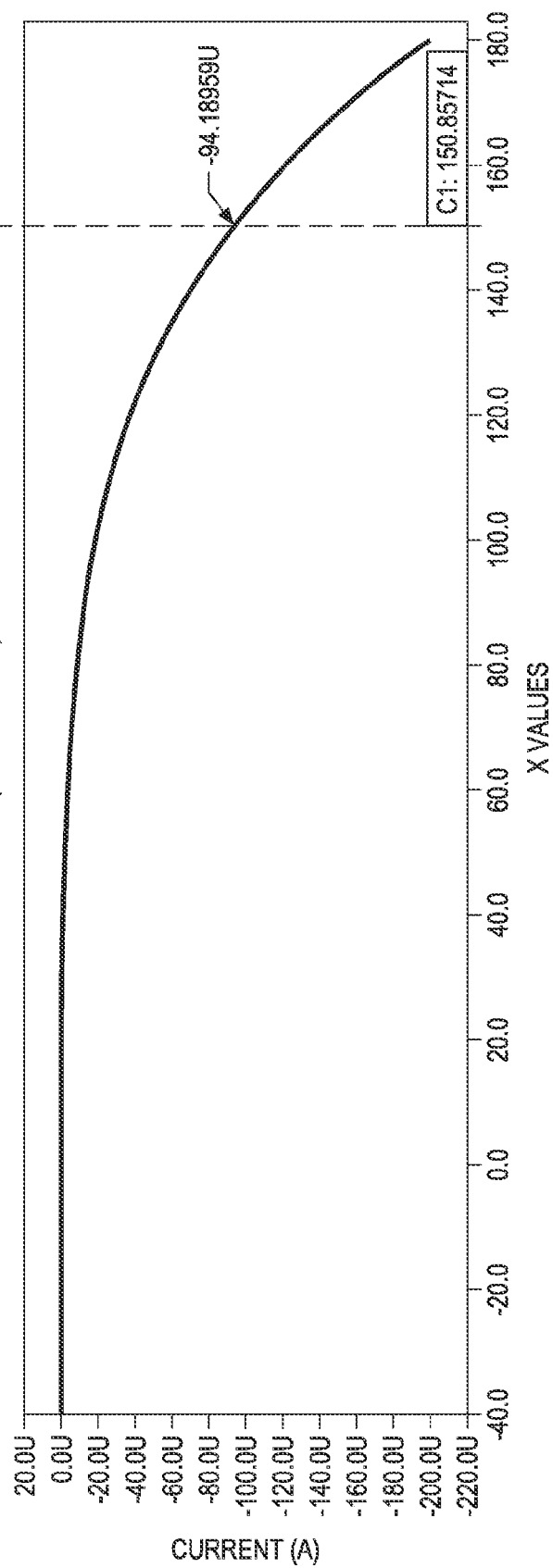
FIG. 5B graphs leakage current in a simulation of the circuit of FIG. 5A.
Figure 8A:
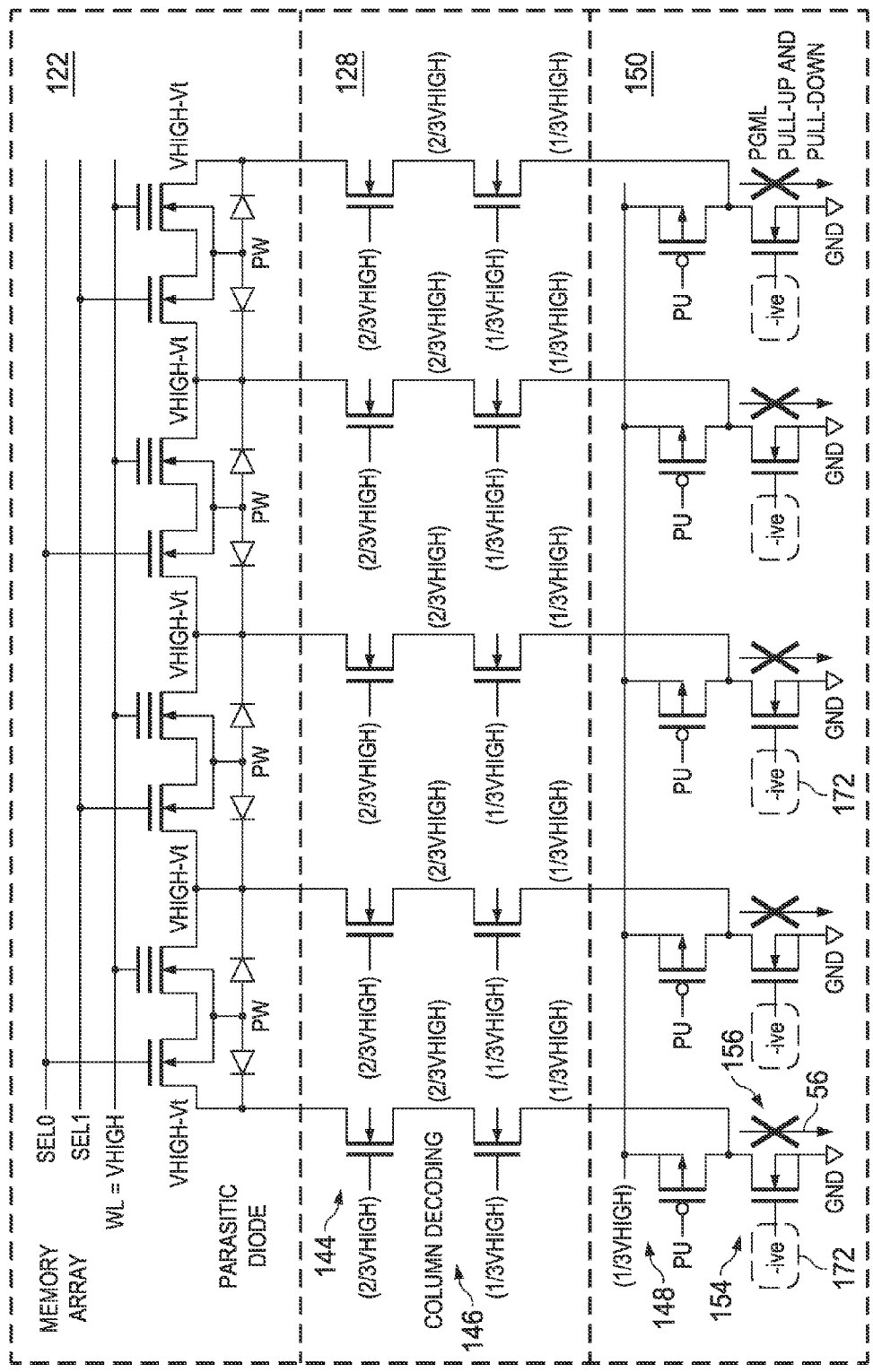
FIG. 8A illustrates details of the memory including application of a negative biasing voltage to address sub-threshold leakage.
Figure 8B:
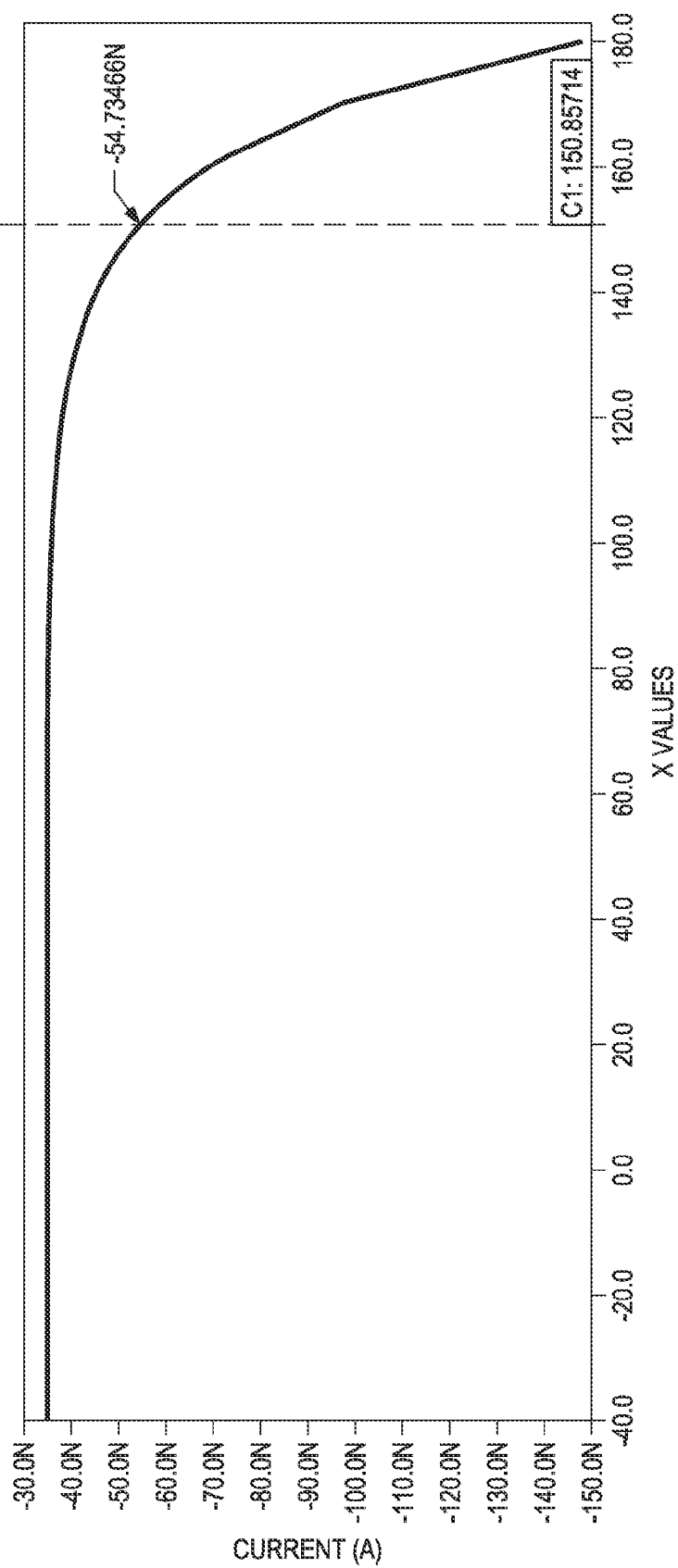
FIG. 8B graphs leakage current in a simulation of the circuit of FIG. 8A.

FIG. 8B illustrates simulation results for a memory of the type shown in FIG. 8A and having a 4 Kbit array density operating in erase mode. The simulation results show that during a worst case the array leakage is about 54 nA (which is significantly reduced from the >90 uA leakage shown in the simulation of FIG. 5B). In this simulation, the negative biasing voltage is −0.5V (with an NMOS threshold voltage Vth≈0.7 V). A small leakage of this scale is much easier for the charge-pump to handle as its current load.

With reference once again to FIG. 6, the column pre-decoder circuit 130 includes a pull-down (PD) driver circuit 138 which functions to selectively apply the negative biasing voltage to the gate terminals of the NMOS pull-down transistors 154 during erase mode. Thus, in connection with the known operations performed by circuitry of the memory to apply voltages as shown in Table 2, above, to the word-lines (WL<>), select lines (SEL<>), bit-lines (BLx<>), p well (PW) and source lines (SLx<>) when configuring the memory for an erase operation, the pull-down (PD) driver circuit 138 responds to placement of the memory in erase mode by passing the negative biasing voltage generated by

|  | WL | SEL0/SEL1 | BL (programmed cell) | BL (not programmed cell) | PW | SL |
|---|---|---|---|---|---|---|
| Selected sector | VHIGH | -ive/-ive | 0 | (VHIGH/3) | 0 | 0 or (VHIGH/3) |
| Non-selected sector | 0 | -ive/-ive | 0 | (VHIGH/3) | 0 | 0 or (VHIGH/3) |

Reference is now made to FIG. 8A which illustrates details of the memory including application of a negative biasing voltage to address sub-threshold leakage. The negative biasing voltage is generated by the negative charge pump circuit the negative charge pump circuit 136 to the gate terminals of the NMOS pull-down transistors 154. This circuitry is preferably implemented as a logic circuit. The operation is illustrated by Table 4:

|  | WL | SEL0/SEL1 | BL (programmed cell) | BL (not programmed cell) | PD | PW | SL |
|---|---|---|---|---|---|---|---|
| Selected sector | 0 | VHIGH | Floating | Floating | -ive | VHIGH | VHIGH |
| Non-selected sector | VHIGH | VHIGH | Floating | Floating | -ive | VHIGH | VHIGH |

A number of advantages accrue from use of the negative biasing voltage techniques described above:

1) In the charge-pump, for a current load (ILOAD), the power of the charge pump to support that current is: ILOAD*4*n, where n is the number of stages in the charge pump. If the current load is increased, then the power of the charge pump to support the increased (LOAD also increases due to an increase in the number of charge pump stages. With a negative biasing voltage in programming and erasing operation, as discussed above, there is reduction in the total current load of the charge-pump and hence there is a reduction in both the total power on chip and the size of the charge pump.

2) With increases in ILOAD, the size of the charge pump capacitor (which stores charge in a voltage doubler scheme) must also increase. If this capacitor is an on-chip device, the increased capacitance occupies more area on the chip. With the negative biasing voltage in programming and erasing operation, as discussed above, a smaller on-chip capacitance is needed and hence the area occupied by the charge pump is smaller and an overall chip size may be smaller.

3) The use of the negative biasing voltage in programming and erasing operation, as discussed above, permits the same charge pump circuitry to be used for different memory densities since there is insignificant change in current load as the density of the memory array increases.

4) The use of the negative biasing voltage in programming and erasing operation, as discussed above, permits the design of a charge pump to address a substantially same leakage current regardless of FFA corner and temperature and for which ripple control can be exercised. There is accordingly less concern with reliability issues (like safe operating area violations) on the chip over a range of operating conditions.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a non-volatile memory cell including an NMOS select transistor and a floating gate transistor connected to the NMOS select transistor in series between a bit line and a source line, the memory cell configurable for operation in a programming mode; and
a selection circuit configured to drive a gate terminal of the NMOS select transistor with a negative bias voltage in response to said memory cell being configured in programming mode to program a data value into said floating gate transistor while said negative bias voltage produces both a negative gate-to-source voltage and a negative gate-to-well voltage on said NMOS select transistor.

2. The circuit of claim 1, wherein said NMOS select transistor has a threshold voltage, and wherein an absolute value of the negative bias voltage is less than or equal to said threshold voltage.

3. The circuit of claim 1, further including circuitry configured, when the memory cell is configured to program the data value into said floating gate transistor, to apply a high voltage in excess of logic high to a gate terminal of the floating gate transistor and a logic low voltage to a bit-line coupled to the memory cell being programmed with the data value.

4. The circuit of claim 3, further including additional memory cells sharing a common word line with the memory cell to be programmed, said selection circuit further configured to drive gate terminals of NMOS select transistors of those additional memory cells also with the negative bias voltage when said memory cell is configured to program the data value.

5. The circuit of claim 4, wherein said additional memory cells include memory cells that are also configured for operation in said programming mode.

6. The circuit of claim 4, wherein said additional memory cells include memory cells that are not configured for operation in said programming mode.

7. The circuit of claim 1, where said memory cell is further configurable for operation in an erase mode, further including:
an NMOS pull-down transistor coupled to said memory cell; and
a pull-down circuit configured to drive a gate terminal of the NMOS pull-down transistor with a negative bias voltage in response to said memory cell being configured in erase mode to erase a data value stored on said floating gate transistor.

8. The circuit of claim 7, wherein said NMOS pull-down transistor is coupled to a source terminal of the NMOS select transistor functional as a select line for the memory cell.

9. The circuit of claim 7, wherein said NMOS pull-down transistor is coupled to a drain terminal of the floating gate transistor functional as a bit-line for the memory cell.

10. The circuit of claim 7, wherein said NMOS pull-down transistor has a threshold voltage, and wherein an absolute value of the negative bias voltage is less than or equal to said threshold voltage.

11. The circuit of claim 7, further including circuitry configured, when the memory cell is configured to erase the data value on said floating gate transistor, to apply a logic low voltage to a gate terminal of the floating gate transistor and a high voltage in excess of logic high voltage to a gate terminal of the NMOS select transistor of the memory cell to be erased.

12. A method, comprising:
configuring a non-volatile memory cell, including an NMOS select transistor and a floating gate transistor connected to the NMOS select transistor in series between a bit line and a source line, in a programming mode; and
driving a gate terminal of the NMOS select transistor with a negative bias voltage in response to said memory cell being configured in programming mode to program a data value into said floating gate transistor, said negative bias voltage producing both a negative gate-to-source voltage and a negative gate-to-well voltage on said NMOS select transistor.

13. The method of claim 12, wherein said NMOS select transistor has a threshold voltage, and further comprising generating the negative bias voltage to have an absolute value less than or equal to said threshold voltage.

14. The method of claim 12, further including additional memory cells sharing a common word line with the memory cell to be programmed, wherein driving comprises driving gate terminals of NMOS select transistors of those additional memory cells also with the negative bias voltage when said memory cell is configured to program the data value.

15. The method of claim 14, wherein said additional memory cells include memory cells that are also configured for operation in said programming mode.

16. The method of claim 14, wherein said additional memory cells include memory cells that are not configured for operation in said programming mode.

17. The method of claim 12, further comprising:
configuring said memory cell for operation in an erase mode; and
driving a gate terminal of an NMOS pull-down transistor coupled to said memory cell with a negative bias voltage in response to said memory cell being configured in erase mode to erase a data value stored on said floating gate transistor.

18. The method of claim 7, wherein said NMOS pull-down transistor is coupled to a source terminal of the NMOS select transistor functional as a select line for the memory cell.

19. The method of claim 17, wherein said NMOS pull-down transistor is coupled to a drain terminal of the floating gate transistor functional as a bit-line for the memory cell.

20. The method of claim 17, wherein said NMOS pull-down transistor has a threshold voltage, and further comprising generating the negative bias voltage to have an absolute value less than or equal to said threshold voltage.

21. A circuit, comprising:
a non-volatile memory cell including an NMOS select transistor and a floating gate transistor series connected to the NMOS select transistor, the memory cell configurable for operation in an erase mode;
an NMOS pull-down transistor coupled to said memory cell; and
a selection circuit configured to drive a gate terminal of the NMOS pull-down transistor with a negative bias voltage in response to said memory cell being configured in erase mode to erase a data value on said floating gate transistor.

22. The circuit of claim 21, wherein said NMOS pull-down transistor has a threshold voltage, and wherein an absolute value of the negative bias voltage is less than or equal to said threshold voltage.

23. The circuit of claim 21, wherein said NMOS pull-down transistor is coupled to a source terminal of the NMOS select transistor functional as a select line for the memory cell.

24. The circuit of claim 21, wherein said NMOS pull-down transistor is coupled to a drain terminal of the floating gate transistor functional as a bit-line for the memory cell.

25. The circuit of claim 21, further including circuitry configured, when the memory cell is configured to erase the data value on said floating gate transistor, to apply a logic low voltage to a gate terminal of the floating gate transistor and a high voltage in excess of logic high voltage to a gate terminal of the NMOS select transistor of the memory cell to be erased.

26. A method, comprising:
configuring a non-volatile memory cell including an NMOS select transistor and a floating gate transistor series connected to the NMOS select transistor in an erase mode; and
driving a gate terminal of an NMOS pull-down transistor coupled to said memory cell with a negative bias voltage in response to said memory cell being configured in erase mode to erase a data value stored on said floating gate transistor.

27. The method of claim 26, wherein said NMOS pull-down transistor has a threshold voltage, and further comprising generating the negative bias voltage to have an absolute value less than or equal to said threshold voltage.

28. The method of claim 26, wherein said NMOS pull-down transistor is coupled to a source terminal of the NMOS select transistor functional as a select line for the memory cell.

29. The method of claim 26, wherein said NMOS pull-down transistor is coupled to a drain terminal of the floating gate transistor functional as a bit-line for the memory cell.

* * * * *